(12) United States Patent
Yang et al.

(10) Patent No.: US 11,079,690 B2
(45) Date of Patent: Aug. 3, 2021

(54) APPARATUS AND METHOD FOR PROCESSING A SUBSTRATE USING THE SAME

(71) Applicant: XIA TAI XIN SEMICONDUCTOR (QING DAO) LTD., Qingdao (CN)

(72) Inventors: Hyun-Suk Yang, Singapore (SG); Soo-Hyoung Kim, Singapore (SG); Sung-Uk Kim, Singapore (SG); Byung-In Kwon, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/808,392

(22) Filed: Mar. 4, 2020

(65) Prior Publication Data

US 2021/0208515 A1    Jul. 8, 2021

(30) Foreign Application Priority Data

Jan. 6, 2020 (CN) .......................... 202010011091.4

(51) Int. Cl.
*G03F 7/20* (2006.01)

(52) U.S. Cl.
CPC ................ *G03F 7/70708* (2013.01)

(58) Field of Classification Search
CPC ..... G03F 7/707; G03F 7/691; H01L 21/6838; H01L 21/68735
See application file for complete search history.

(56) References Cited

U.S. PATENT DOCUMENTS

| 2008/0239275 A1* | 10/2008 | Mizutani | ............. | H01L 21/6875 355/73 |
| 2009/0033906 A1* | 2/2009 | Kumazaki | ............. | G03F 7/7075 355/72 |

* cited by examiner

*Primary Examiner* — Steven Whitesell Gordon
(74) *Attorney, Agent, or Firm* — ScienBiziP, P.C.

(57) ABSTRACT

An apparatus for processing the substrate includes a substrate stage and a source. The substrate stage is configured to support a substrate thereon. The substrate stage includes a substrate support formed with a first opening therein. The first opening is an annular opening. The source is coupled to the first opening and is configured to supply first gas/air to a bottom surface of the substrate through the first opening.

10 Claims, 19 Drawing Sheets

APPARATUS AND METHOD FOR PROCESSING A SUBSTRATE USING THE SAME

CROSS-REFERENCE TO RELATED APPLICATION

This application claims the benefit of and priority to a Chinese Patent Application No. 202010011091.4 filed on Jan. 6, 2020, the entire content of which is incorporated by reference herein.

BACKGROUND

Generally, photolithography is carried out to form and pattern a photosensitive layer on the semiconductor substrate, such as a photoresist layer. In order to do this, during photolithography process, a semiconductor substrate is first coat with a layer of photoresist material. The layer of photoresist is then subject to an exposure process for developing/defining predetermined patterns. During the photoresist exposure process, the substrate is transfer into the exposure tool, for example, scanner or stepper, and retained on the substrate stage by vacuum. A pattern is formed by the light going through a photomask or a reticle, which projects the pattern image onto the substrate. However, particles at the backside of the substrate or on a top surface of the substrate stage may induce substrate deformation, and the deformation of the substrate may induce unexpected results during the exposure process.

BRIEF DESCRIPTION OF THE DRAWINGS

The drawings are directed to a manner in which the recited features of the present disclosure can be understood in detail, and to a more particular description of the disclosure briefly summarized above which may be had by reference to implementation, some of which are illustrated in the drawings. It is to be noted, however, that the drawings illustrate only typical implementation of this disclosure and are therefore not to be considered limiting of its scope, for the disclosure may relate to other equally effective implementation.

Figure 1:
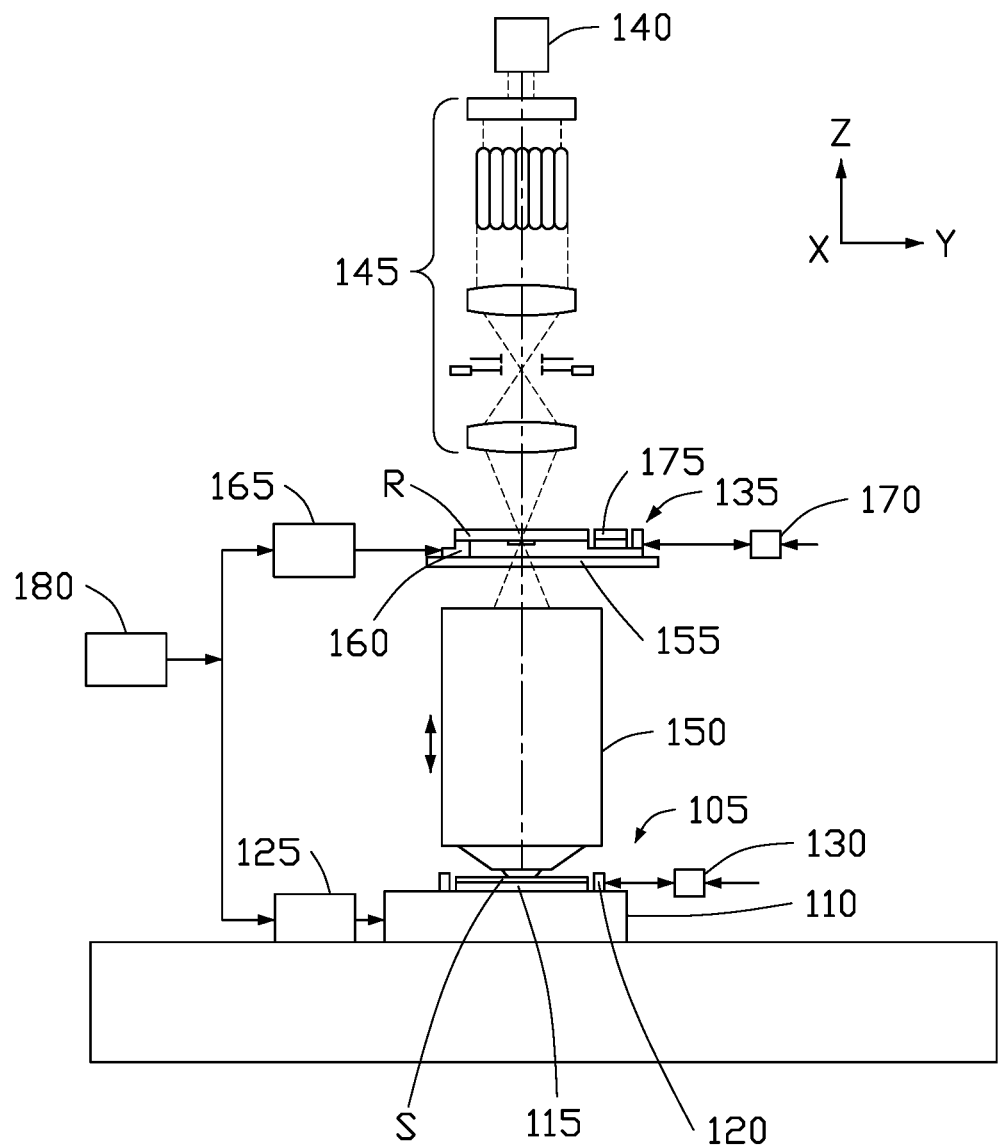
FIG. 1 is a schematic view illustrating an apparatus 100 for processing a substrate according to some embodiments of the present disclosure.

It is to be noted, however, that the appended drawings illustrate only example implementation of this disclosure and are therefore not to be considered limiting of its scope, for the disclosure may relate to other equally effective implementation.

It should be noted that these figures are intended to illustrate the general characteristics of methods, structure and/or materials utilized in certain example implementation and to supplement the written description provided below. These drawings are not, however, to scale and may not precisely reflect the precise structural or performance characteristics of any given implementation, and should not be interpreted as defining or limiting the range of values or properties encompassed by example implementation. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which example implementation of the disclosure are shown. This disclosure may, however, be implemented in many different forms and should not be construed as limited to the example implementation set forth herein. Rather, these example implementation are provided so that this disclosure will be thorough and complete, and will fully convey the scope of the disclosure to those skilled in the art. Like reference numerals refer to like elements throughout.

The terminology used herein is for the purpose of describing particular example implementation only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a schematic view illustrating an apparatus 100 for processing a substrate according to some embodiments of the present disclosure. In this embodiment, the apparatus 100 is a lithographic apparatus configured to transfer a pattern of a reticle onto a substrate. In an alternative embodiment, the apparatus 100 is configured to examine or inspect, e.g., a surface, of a substrate. As illustrated in FIG. 1, the apparatus 100 includes a substrate stage 105 configured to support a substrate (S) thereon. As will described below, the substrate stage 105 is configured to direct first gas/air to a bottom surface of the substrate (S), elevating/floating the substrate (S) thereabove, and to evacuate second gas/air under the bottom surface of the substrate (S) to stabilize a position of the substrate (S).

In this embodiment, the substrate stage 105 includes a substrate stage base 110, a substrate support 115, a substrate edge holder 120, a substrate stage driving unit 125, and a first interferometer 130. The substrate support 115 is mounted on the substrate stage base 110. The substrate edge holder 120 is mounted on the substrate stage base 110 and is configured to hold the substrate (S) above the substrate support 115. In some embodiments, the substrate stage base 110 is configured to move in the x and y directions to thereby move the substrate support 115 and the substrate edge holder 120 in the x and y directions. In other embodiments, the substrate stage base 110 is configured to move in the x, y, and z directions to thereby move the substrate support 115 and the substrate edge holder 120 in the x, y, and z directions.

The substrate stage driving unit 125 is coupled to and configured to drive movement of the substrate stage base 110. The first interferometer 130 is adjacent the substrate stage base 110 and is configured to track positions of the substrate stage base 110.

As illustrated in FIG. 1, the apparatus 100 further includes a reticle stage 135, a light source 140, an illumination module 145, and a projection module 150. In this embodiment, the reticle stage 135 includes a reticle stage base 155, a reticle support 160, a reticle stage driving unit 165, a second interferometer 170, and a determination unit 175. The reticle support 160 is mounted on the reticle stage base 155 and is configured to support a reticle (R) thereon. In some embodiments, the reticle stage base 155 is configured to move in the x and y directions to thereby move the reticle support 160 in the x and y directions. In other embodiments, the reticle stage base 155 is configured to move in the x, y, and z directions to thereby move the reticle support 160 in the x, y, and z directions. The reticle stage driving unit 165 is coupled to and is configured to drive movement of the reticle stage base 155. The second interferometer 170 is adjacent the reticle stage base 155 and is configured to track positions of the reticle stage base 155. The determination unit 175 is adjacent the reticle stage base 155 and is configured to determine features, e.g., type and shape, of the reticle (R).

In various embodiments, the determination unit 175 includes a reading unit, an image sensing unit, and an image processing unit. The reading unit is configured to read an identifier, such as a barcode, marked on the reticle (R). The image sensing unit is configured to sense an image of the reticle (R) and may include an area sensor, a reflective sensor, camera, and the like. The image processing unit is configured to process the reticle (R) identifier read by the reading unit and a reticle (R) image sensed by the image sensing unit.

The light source 140 is configured to generate light. The illumination module 145 is configured to direct the light generated by the light source 140 to the reticle (R), generating a reticle (R) image pattern. The projection module 150 is configured to project the reticle (R) image pattern at a predetermined magnification, such as ¼ or ⅕, onto the substrate (S).

In certain embodiments, the projection module 150 includes a plurality of optical modules, each of which includes a plurality of lenses. One of the optical modules may further include a concave mirror (e.g., a catadioptric optical system). Another one of the optical modules may further include a diffractive optical element, such as a kinoform, and a full mirror module.

As illustrated in FIG. 1, the apparatus 100 further includes a control unit 180 coupled to and configured to control operations of the substrate stage driving unit 125 and the reticle stage driving unit 165. In one embodiment, the control unit 180 includes a central processing unit (CPU) and a memory.

Figure 2:
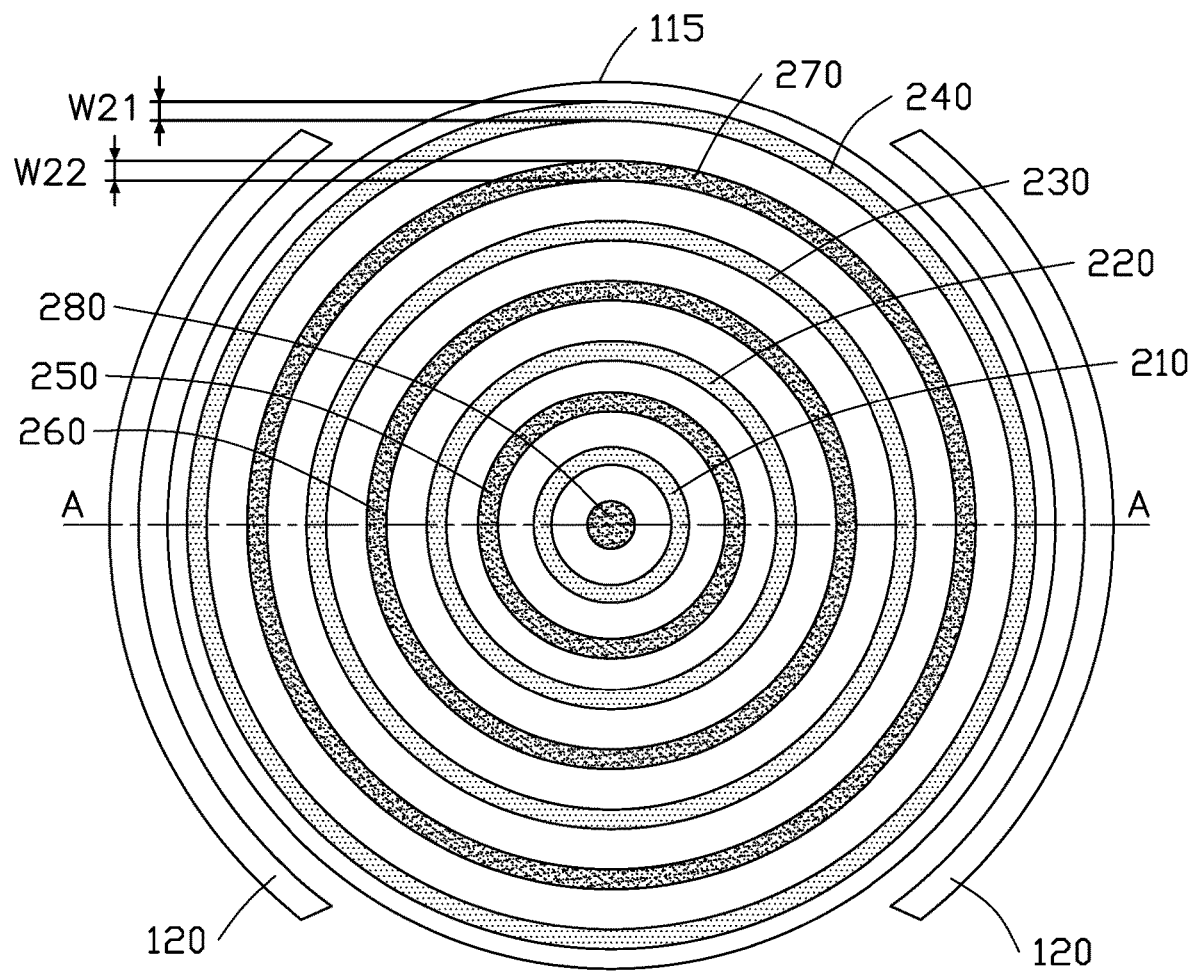
FIG. 2 is a schematic view illustrating a top view of the first embodiment of a substrate support according to some embodiments of the present disclosure.

FIG. 2 is a schematic view illustrating a top view of the first embodiment of a substrate support according to some embodiments of the present disclosure. As illustrated in FIG. 2, the substrate support 115 is formed with a plurality of first openings 210, 220, 230, 240, a plurality of second openings 250, 260, 270, and a center opening 280. First gas/air may be directed to the bottom surface of the substrate (S) through the first openings 210-240, elevating/floating the substrate (S) above the substrate support 115. The first openings 210-240 are elongated openings. The construction as such permit even distribution of the first gas/air between the substrate support 115 and the substrate (S).

Second gas/air between the substrate support 115 and the substrate (S) may be evacuated through the second openings 250-270 to stabilize a position of the substrate (S) above the substrate support 115.

In this exemplary embodiment, the first and second openings 210-270 are annular and concentric openings. As illustrated in FIG. 2, the first and second openings 210-270 are continuous annular or closed loop openings. In various embodiments, a distance between an adjacent pair of the first and second openings, e.g., openings 220 and 260, is less than or equal to about 15 mm. As illustrated in FIG. 2, the first and second openings 210-270 are alternately arranged. Other arrangements are contemplated herein. For example, in some embodiments, the first openings 210-240 surround the second openings 250-270. In other embodiments, the second openings 250-270 surround the first openings 210-240.

Although the substrate support 115 is exemplified with four openings 210-240 and three openings 250-270, it should be apparent to those skilled in the art that, after reading this disclosure, the number of the first/second openings may be increased or decreased as required. For example, in certain embodiments, the number of the first openings, e.g., 5, is equal to the number of the second openings.

As illustrated in FIG. 2, the first openings 210-240 have substantially the same width (W21). In some embodiments, the width (W21) of the first openings 210-240 is substantially the same as a width (W22) of the second openings 250-270. In other embodiments, the width (W21) of the first openings 210-240 is different from, i.e., less or greater than, the width (W22) of the second openings 250-270.

The center opening 280 facilitates evacuation of the second gas/air therethrough. In this embodiment, the center opening 280 has a width larger than the widths (W21, W22) of the first and second openings 210-270. In an alternative embodiment, the substrate support 115 may be dispensed with the center opening 280.

As illustrated in FIG. 2, the substrate edge holder 120 includes a pair of edge holder members at opposite sides of the substrate support 115, respectively, and extend along an edge of the substrate support 115. In this embodiment, each of the edge holder members of the substrate edge holder 120 is curved. In an alternative embodiment, each of the edge holder members of the substrate edge holder 120 is straight.

Although the substrate edge holder 120 is exemplified with a pair of edge holder members, it should be apparent to those skilled in the art that, after reading this disclosure, number of the edge holder members may be increased or decreased as required. For example, in some embodiments, the substrate edge holder 120 may include a single edge holder member that completely or partially surrounds the substrate support 115. In other embodiments, the substrate edge holder 120 may include three or more edge holder members arranged around the substrate support 115.

Figure 3:
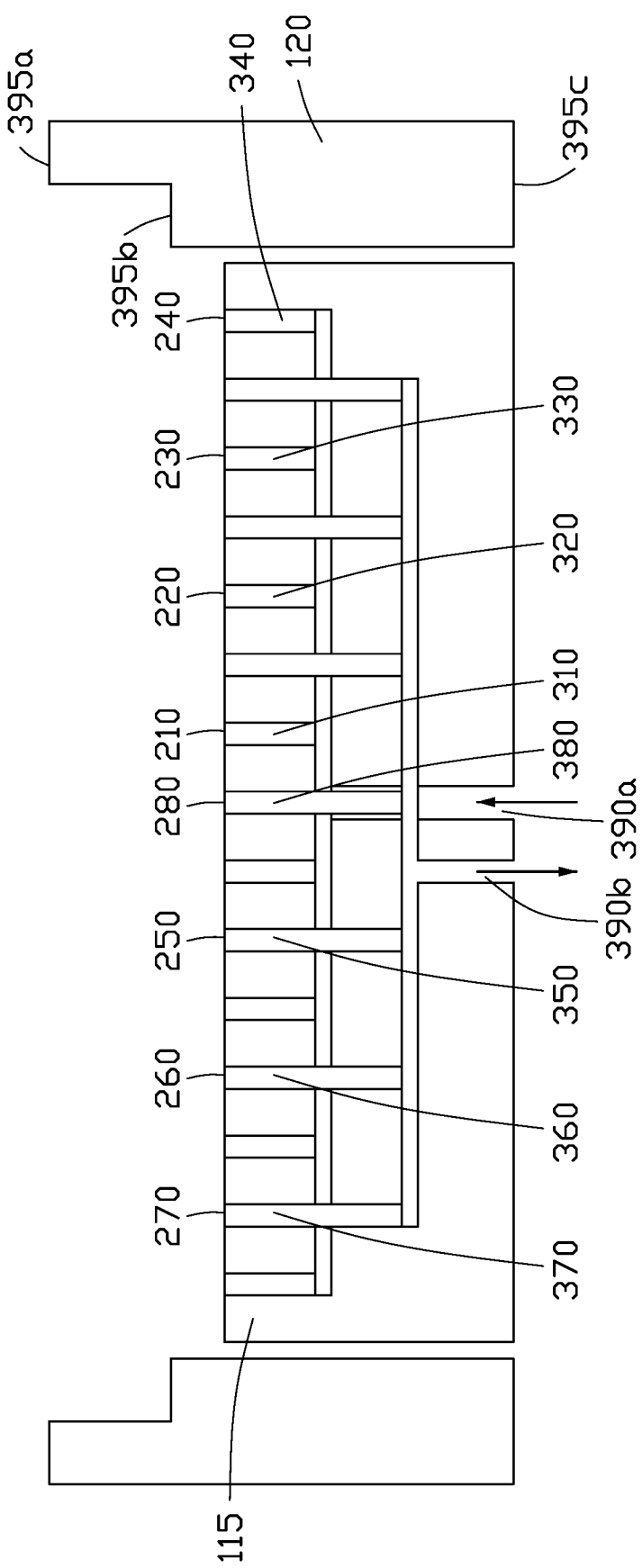
FIG. 3 is a schematic view illustrating a cross-sectional view of the first embodiment of a substrate edge holder in FIG. 2 taken along A-A line according to some embodiments of the present disclosure.

FIG. 3 is a schematic view illustrating a cross-sectional view of the substrate support 115 in FIG. 2 and a cross-sectional view of the first embodiment of a substrate edge holder in FIG. 2 taken along A-A line according to some embodiments of the present disclosure. As illustrated in FIG. 3, the substrate support 115 is further formed with a plurality of first channels 310, 320, 320 and 340, a plurality of second channels 350, 360 and 370, a center channel 380, a first inlet 390a, and a second inlet 390b. Each of the first, second, and center channels 310-380 is connected to a respective one of the first, second, and center openings 210-280. In this embodiment, each of the first, second, and center channels 310-380 has substantially the same width as the respective one of the first, second, and center openings 210-280. The first inlet 390a is connected to the first openings 210-240 through the first channels 310-340, is substantially at the center of the substrate support 115, and is configured to receive the first gas/air from a gas/air source (not shown). The second inlet 390b is connected to the openings 250-280 through the channels 350-380, is between the edge and the center of the substrate support 115, and is coupled to a vacuum (not shown).

Each of the members of the substrate edge holder 120 includes top and bottom surfaces and a middle surface between the top and bottom surfaces, above a top surface of the substrate support 115 and configured to support the edge of the substrate (S) thereon.

Figure 4:
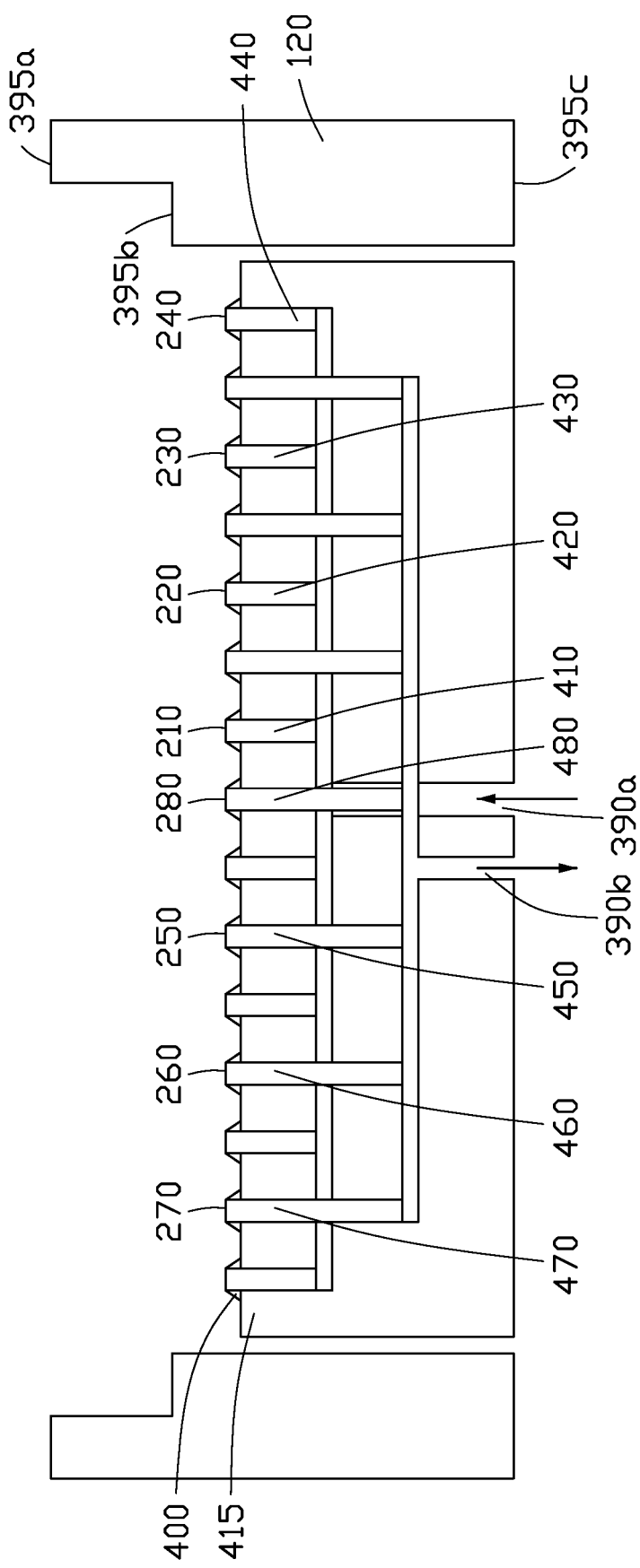
FIG. 4 is a schematic view illustrating a cross-sectional view of the second embodiment of a substrate support in FIG. 2 taken along A-A line according to some embodiments of the present disclosure.

FIG. 4 is a schematic view illustrating a cross-sectional view of the second embodiment of a substrate support in FIG. 2 taken along A-A line according to some embodiments of the present disclosure. As illustrated in FIG. 4, the substrate support 415 of this embodiment differs from the substrate support 115 in that the substrate support 415 includes a plurality of raised portions 400 on the top surface of the substrate support 415. Each of the first, second, and center openings 210-280 is formed in a respective one of the raised portions 400. Each of the first, second, and center channels 410-480 extends to a respective one of the first, second, and center openings 210-280 through a respective one of the raised portions 400.

Figure 5:
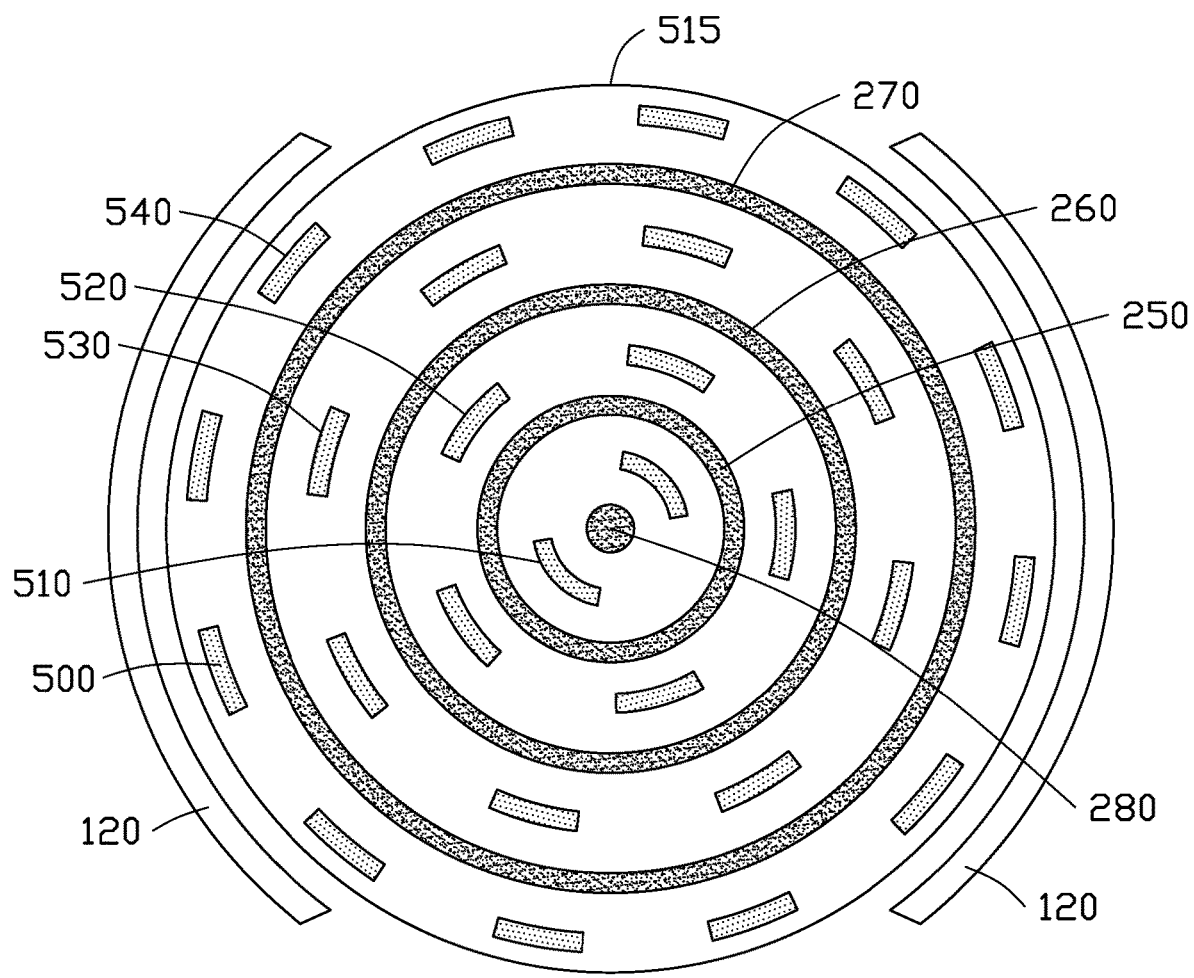
FIG. 5 is a schematic view illustrating a top view of the third embodiment of a substrate support according to some embodiments of the present disclosure.

FIG. 5 is a schematic view illustrating a top view of the third embodiment of a substrate support according to some embodiments of the present disclosure. As illustrated in FIG. 5, the substrate support 515 of this embodiment differs from the substrate support 115 in that the first openings 510-540 of the substrate support 515 are discontinuous annular openings. In this embodiment, each of the first openings 510-540 includes a plurality of spaced apart gas/air segments 500. In some embodiments, the segments 500 are curved. In other embodiments, the segments 500 are straight.

Figure 6:
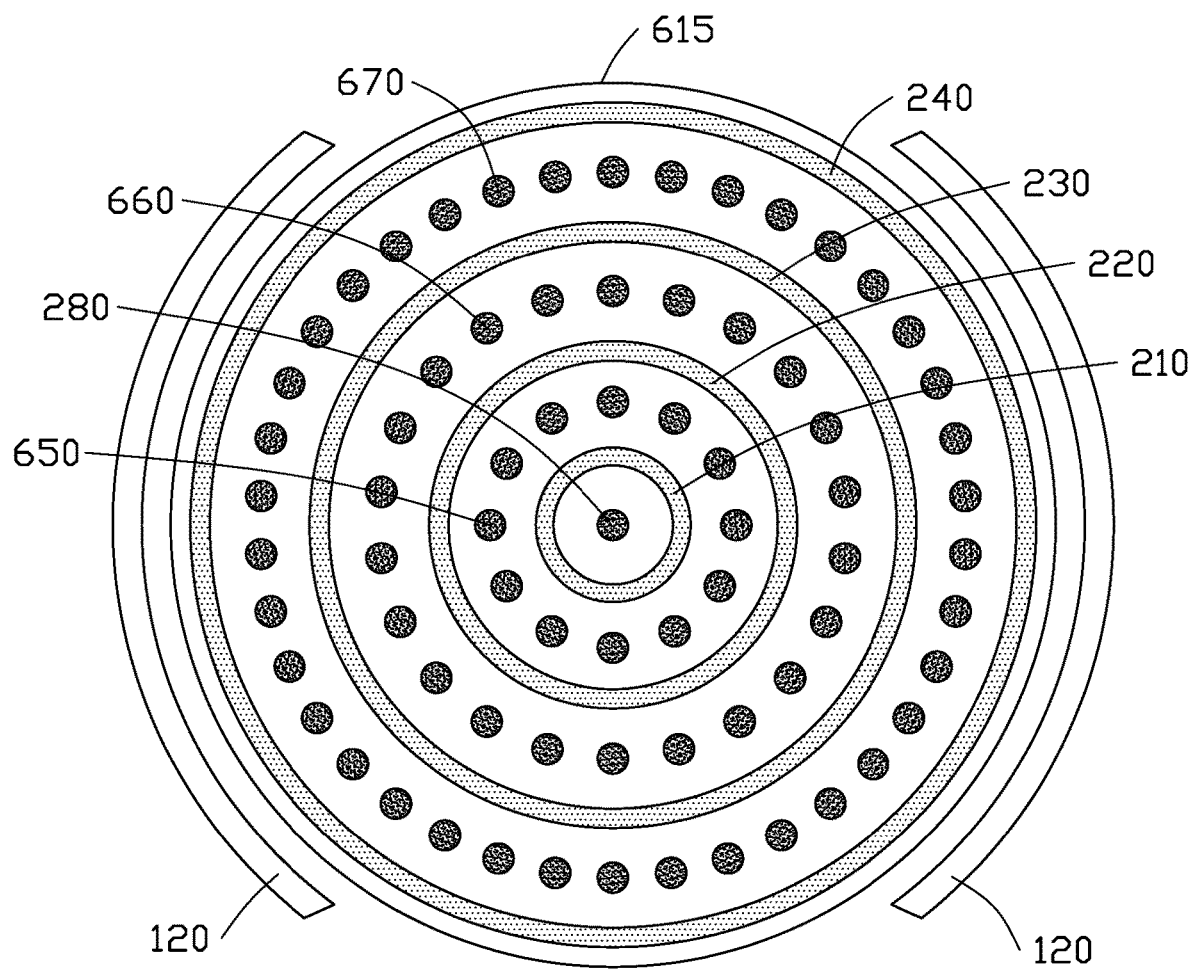
FIG. 6 is a schematic view illustrating a top view of the fourth embodiment of a substrate support according to some embodiments of the present disclosure.

FIG. 6 is a schematic view illustrating a top view of the fourth embodiment of a substrate support according to some embodiments of the present disclosure. As illustrated in FIG. 6, the substrate support 615 of this embodiment differs from the substrate support 115 in that the second openings 650-670 of the substrate support 615 includes a plurality of spaced apart rounded holes.

Figure 7:
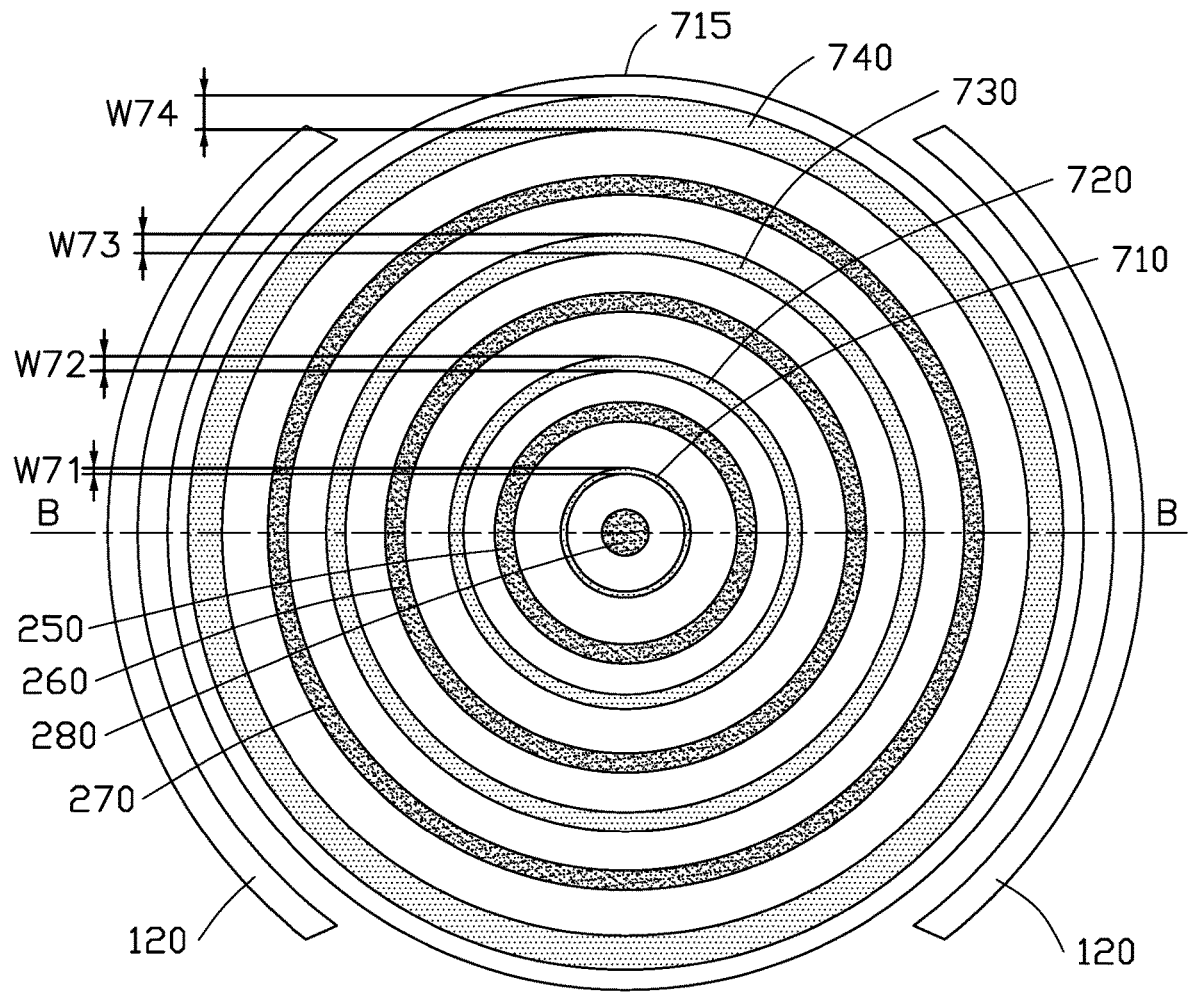
FIG. 7 is a schematic view illustrating a top view of the fifth embodiment of a substrate support according to some embodiments of the present disclosure.

FIG. 7 is a schematic view illustrating a top view of the fifth embodiment of a substrate support according to some embodiments of the present disclosure. As illustrated in FIG. 7, the first openings 710-740 have different widths (W71, W72, W73, W74) from each other. For example, the widths W71, W72, W73, W74 increases from the innermost opening, i.e., opening 710, to the outermost opening, i.e., opening 740. In other words, the width W74 is greater than the width W73, the width W73 is greater than the width W72, and the width W72 is greater than the width W71. The construction as such permits a relatively uniform distribution of the first gas/air on the bottom surface of the substrate (S).

In an embodiment, the width (W71) of the first opening 710 is less than the widths of the second openings 250-270. In some embodiments, the width (W72) of the first opening 720 is substantially the same as the widths of the second openings 250-270. In other embodiments, the widths (W73, W74) of the first openings 730, 740 are greater than the widths of the second openings 250-270.

Figure 8:
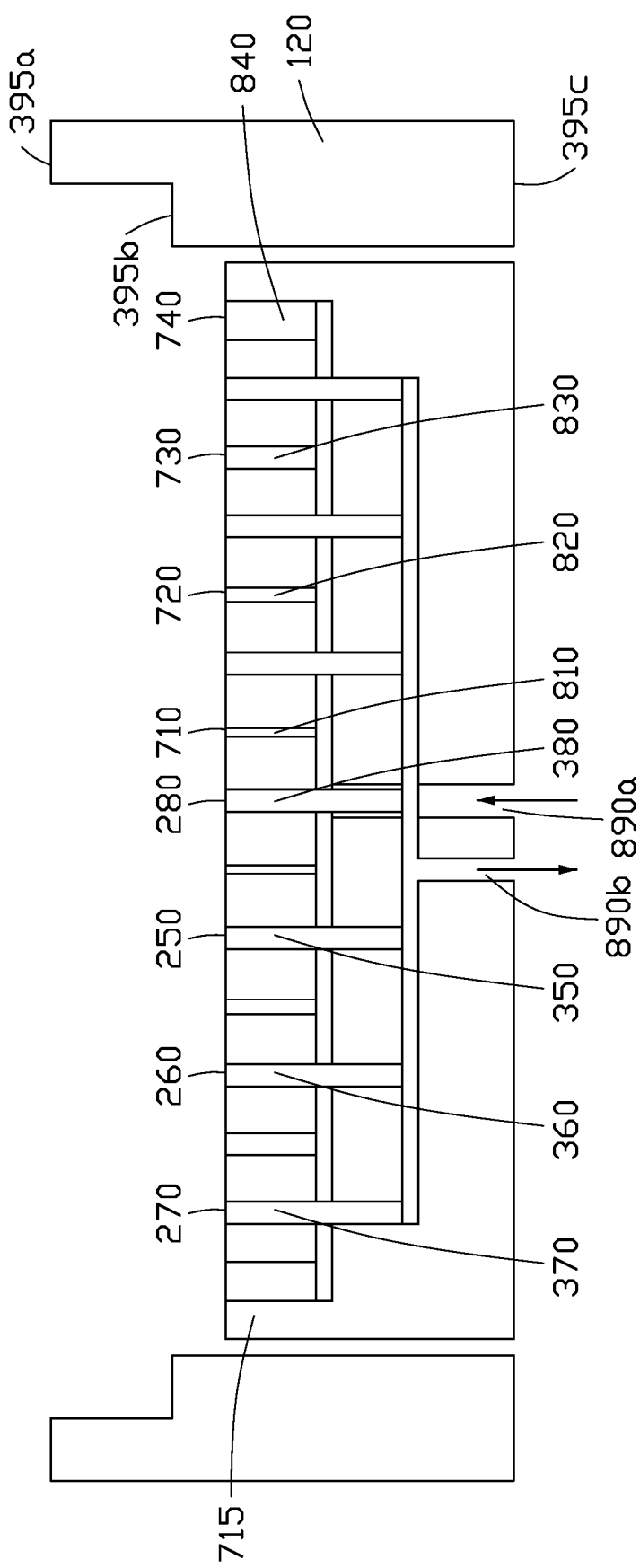
FIG. 8 is a schematic view illustrating a cross-sectional view of a substrate support in FIG. 7 taken along B-B line according to some embodiments of the present disclosure.

FIG. 8 is a schematic view illustrating a cross-sectional view of the substrate support 715 in FIG. 7 taken along B-B line according to some embodiments of the present disclosure. As illustrated in FIG. 8, each of the first channels 810-840 has substantially the same width as a respective one of the first openings 710-740. The first inlet 890a is at the center of the substrate support 715.

In certain embodiments, the widths W71, W72, W73, W74 decreases from the innermost opening, i.e., opening 710, to the outermost opening, i.e., opening 740. In such certain embodiments, the first inlet 890a is substantially at the edge of the substrate support 715.

Figure 9:
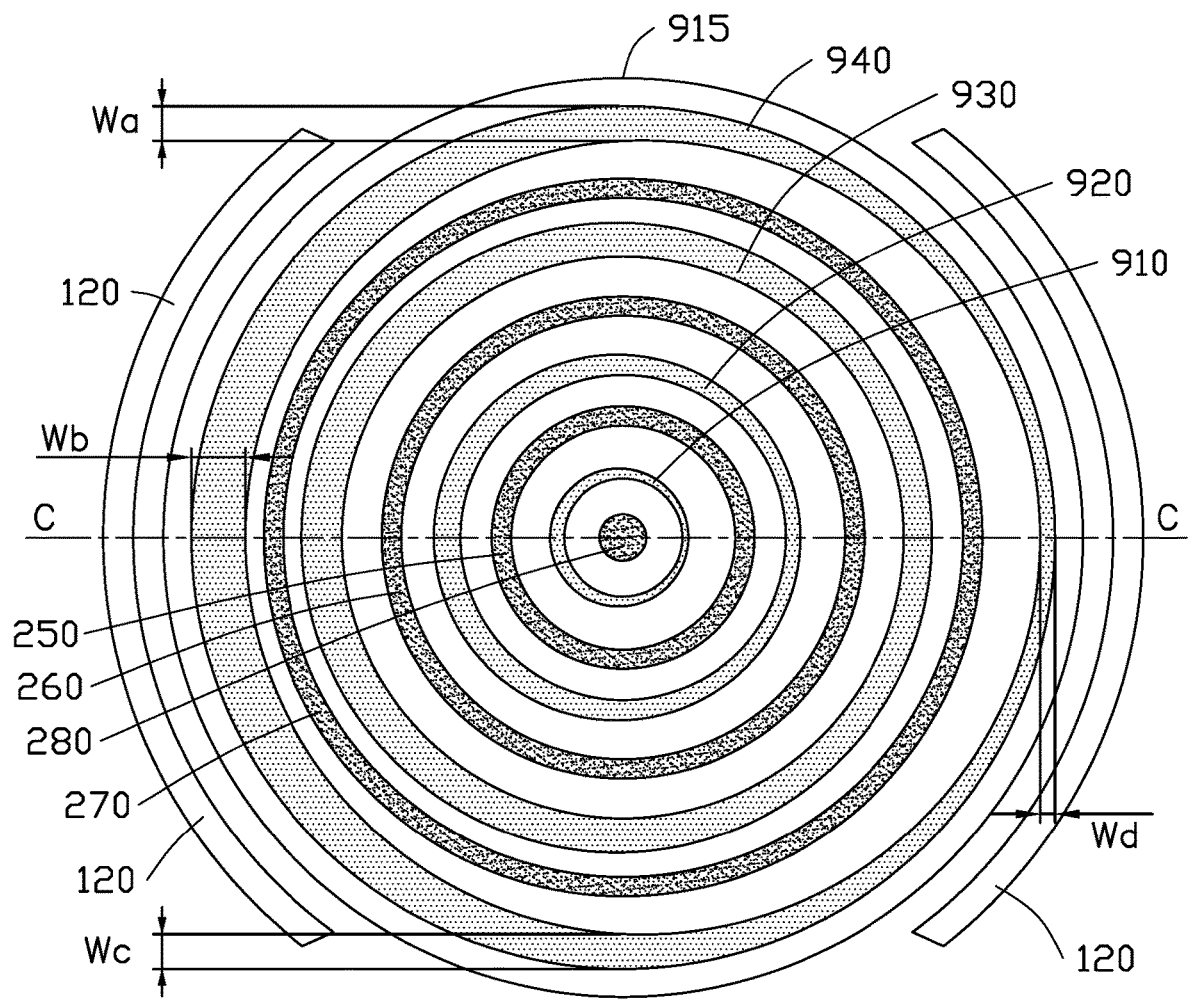
FIG. 9 is a schematic view illustrating a top view of the sixth embodiment of a substrate support according to some embodiments of the present disclosure.

FIG. 9 is a schematic view illustrating a top view of the sixth embodiment of a substrate support according to some embodiments of the present disclosure. As illustrated in FIG. 9, the substrate support 915 of this embodiment differs from the substrate support 115 in that the each of the first openings 910-940 has a width that varies along the length thereof. For example, a left side of the opening 940 has a width (Wb) larger than a width (Wd) of a right side of the opening 940. A top of the opening 940 has a width (Wa) substantially the same as a width (Wc) of a bottom of the opening 940. The widths (Wa, Wc) are smaller than the width (Wb) and larger than the width (Wd).

Figure 10:
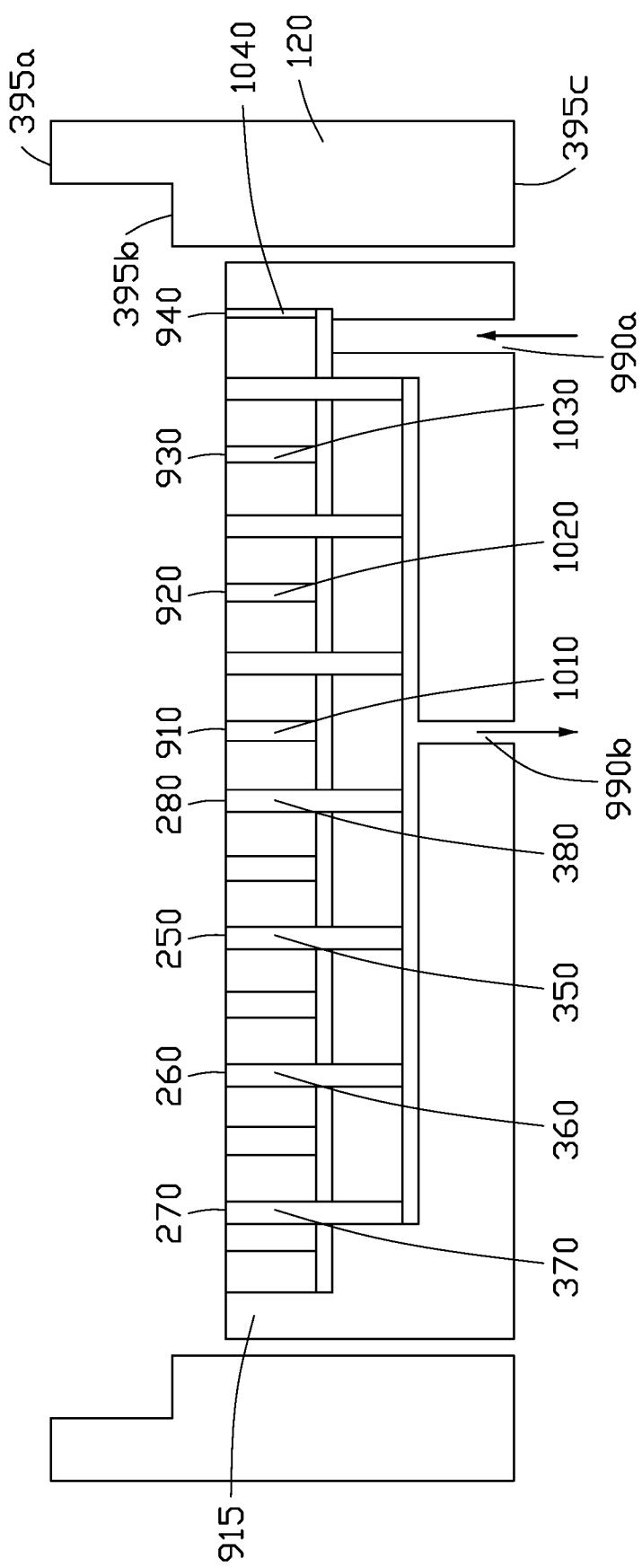
FIG. 10 is a schematic view illustrating a cross-sectional view of the substrate support in FIG. 9 taken along C-C line according to some embodiments of the present disclosure.

FIG. 10 is a schematic view illustrating a cross-sectional view of the substrate support 915 in FIG. 9 taken along C-C line according to some embodiments of the present disclosure. As illustrated in FIG. 10, each of the first channels 1010-1040 has substantially the same width as a corresponding one of the first openings 910-940. In this exemplary embodiment, the first inlet 990a is substantially at the edge of the substrate support 915.

Figure 11:
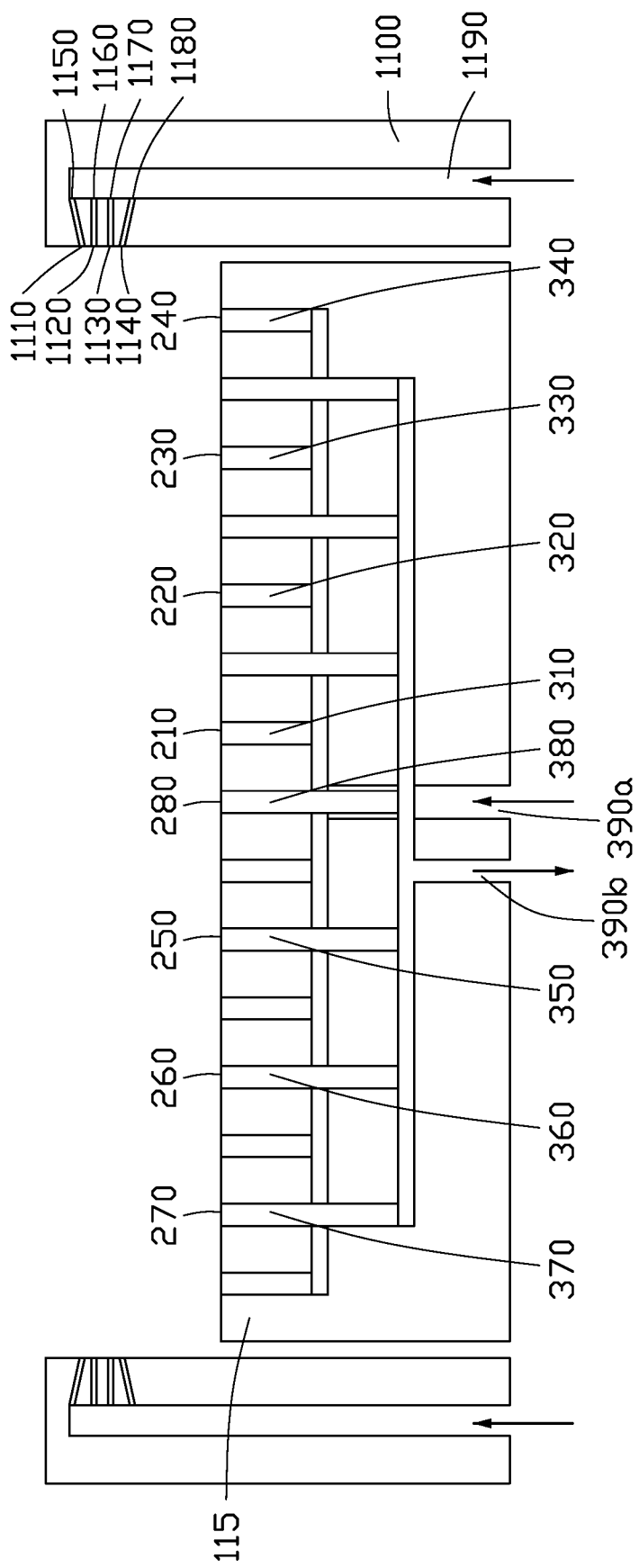
FIG. 11 is a schematic view illustrating a cross-sectional view of the second embodiment of a substrate edge holder in FIG. 2 taken along A-A line according to some embodiments of the present disclosure.

FIG. 11 is a schematic view illustrating a cross-sectional view of the second embodiment of a substrate edge holder 1100 in FIG. 2 taken along A-A line according to some embodiments of the present disclosure. As illustrated in FIG. 11, the substrate edge holder 1100 of this embodiment differs from the substrate edge holder 120 in that the substrate edge holder 1100 has a sidewall formed with a plurality of third openings 1110, 1120, 1130, 1140, a plurality of third channels 1150, 1160, 1170, 1180, and a third inlet 1190.

Each of the third channels 1150-1180 is connected to a respective one of the third openings 1110-1140. The third inlet 1190 is connected between the third channels 1150-1180 and the gas/air source.

Third gas/air may be directed to the edge of the substrate (S) by the gas/air source through the third inlet 1190, the third channels 1150-1180, and the third openings 1110-1140 to maintain the substrate (S) at the center of the substrate support 115, i.e., minimizing sideward movement of the substrate with respect to the substrate support 115 while the substrate (S) is floating above the substrate support 115.

Although the substrate edge holder 1100 is exemplified with four openings 1110-1140, it should be apparent to those skilled in the art that, after reading this disclosure, the number of third openings may be increased or decreased as required.

Figure 12:
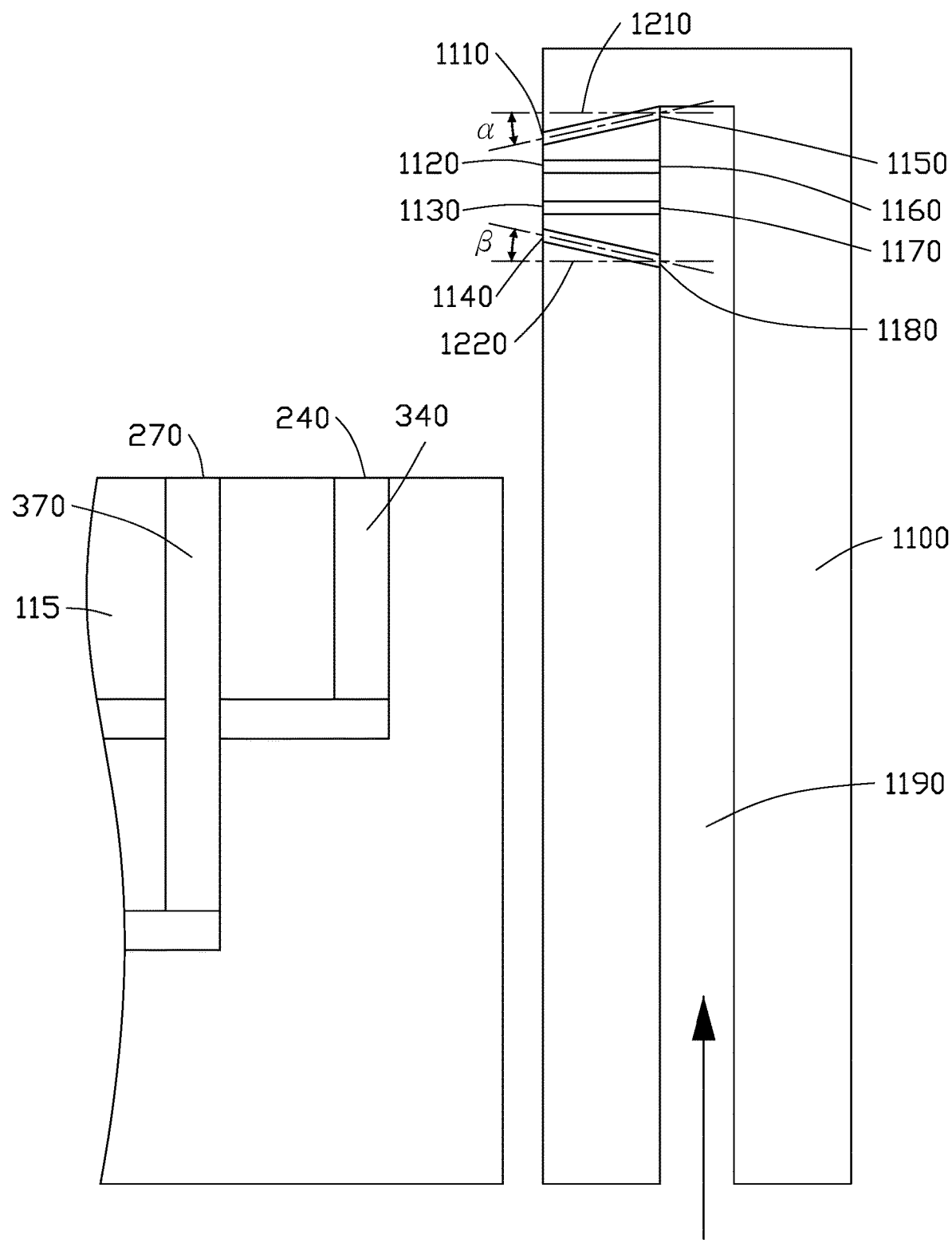
FIG. 12 is a schematic view illustrating a partial cross-sectional view of a substrate support and an enlarge cross-sectional view of the substrate edge holder in FIG. 11 according to some embodiments of the present disclosure.

FIG. 12 is a schematic view illustrating a partial cross-sectional view of the substrate support 115 and an enlarge cross-sectional view of the substrate edge holder 1100 in FIG. 11 according to some embodiments of the present disclosure. As illustrated in FIG. 12, the third channels 1150, 1180 form angles α and β with horizontal lines 1210, 1220 perpendicular to the inlet 1190, respectively. In this embodiment, each of the angles α and β is equal to or larger than about 20 degrees, e.g., about 20±0.5 degrees. In some embodiments, each of the third channels 1160, 1170 extends substantially perpendicular to the inlet 1190. In other embodiments, each of the third channels 1160, 1170 forms an obtuse/acute angle with the inlet 1190.

Figure 13:
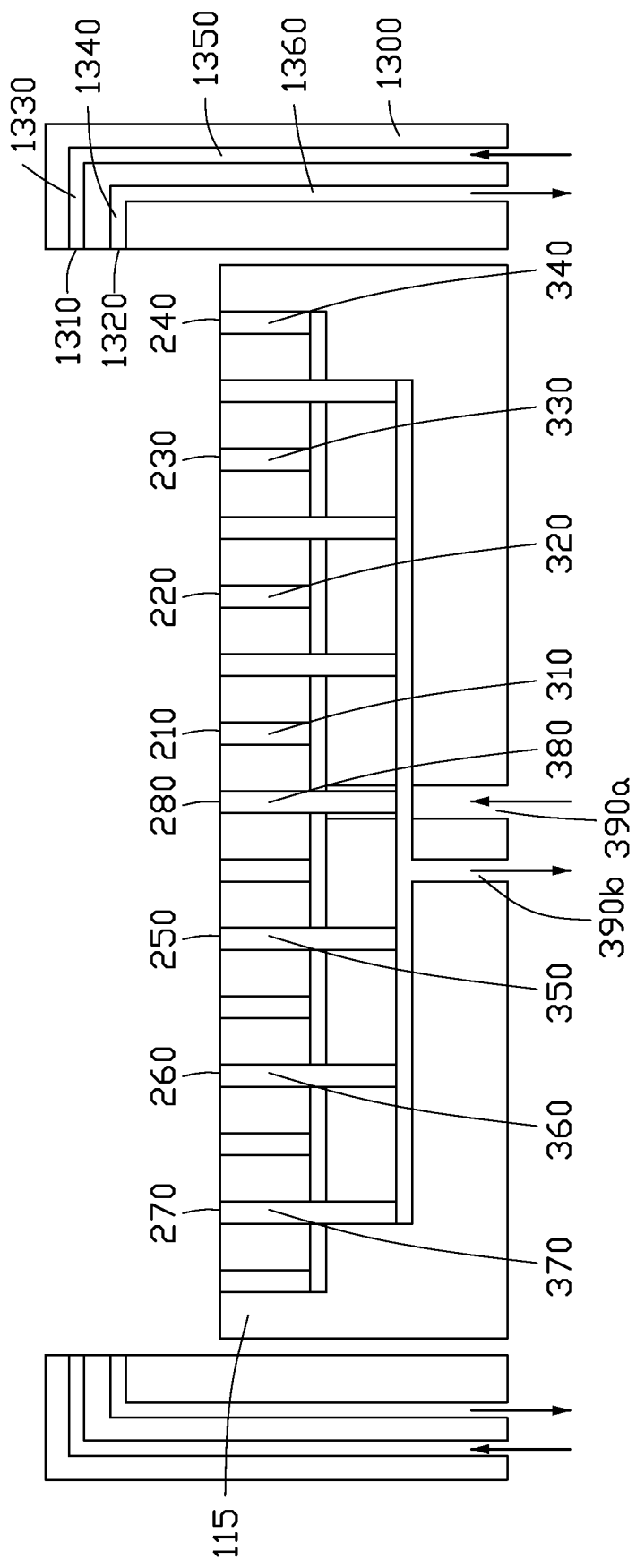
FIG. 13 is a schematic view illustrating a cross-sectional view of the third embodiment of a substrate edge holder in FIG. 2 taken along A-A line according to some embodiments of the present disclosure.

FIG. 13 is a schematic view illustrating a cross-sectional view of the third embodiment of a substrate edge holder in FIG. 2 taken along A-A line according to some embodiments of the present disclosure. As illustrated in FIG. 13, the substrate edge holder 1310 of this embodiment differs from the substrate edge holder 120 in that the substrate edge holder 1310 has a sidewall formed with third and fourth openings 1310, 1320, third and fourth channels 1330, 1340, and third and fourth inlets 1350, 1360.

Each of the third and fourth channels 1330, 1340 is connected to a respective one of the third and fourth openings 1310, 1320. Each of the third and fourth inlets 1350, 1360 is connected between a respective one of the third and fourth channels 1330, 1340 and a respective one of the gas/air source and the vacuum.

The first gas/air may be directed to the edge of the substrate (S) by the gas/air source through the third inlet, 1350, the third channel 1330, and the third opening 1310 to maintain the substrate (S) at the center of the substrate support 115.

The second gas/air may be evacuated by the vacuum through the fourth opening 1320, the fourth channel 1340, and the fourth inlet 1360 of the substrate edge holder 1300.

Figure 14:
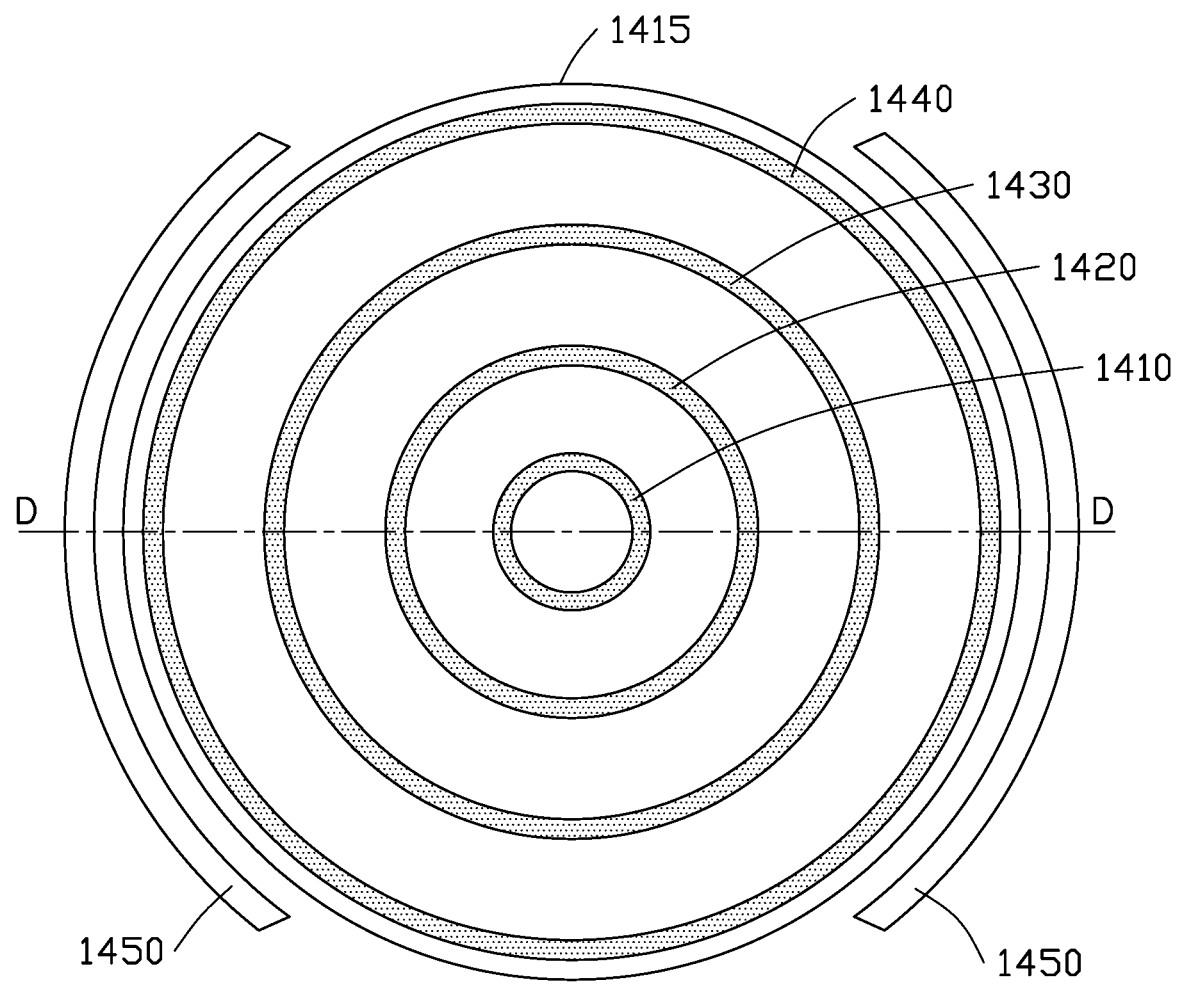
FIG. 14 is a schematic view illustrating a top view of the seventh embodiment of a substrate support according to some embodiments of the present disclosure.

FIG. 14 is a schematic view illustrating a top view of the seventh embodiment of a substrate support according to some embodiments of the present disclosure. As illustrated in FIG. 14, the substrate support 1415 of this embodiment differs from the substrate support 115 in that the substrate support 1415 is dispensed with the second openings 250-270 and the center opening 280.

Figure 15:
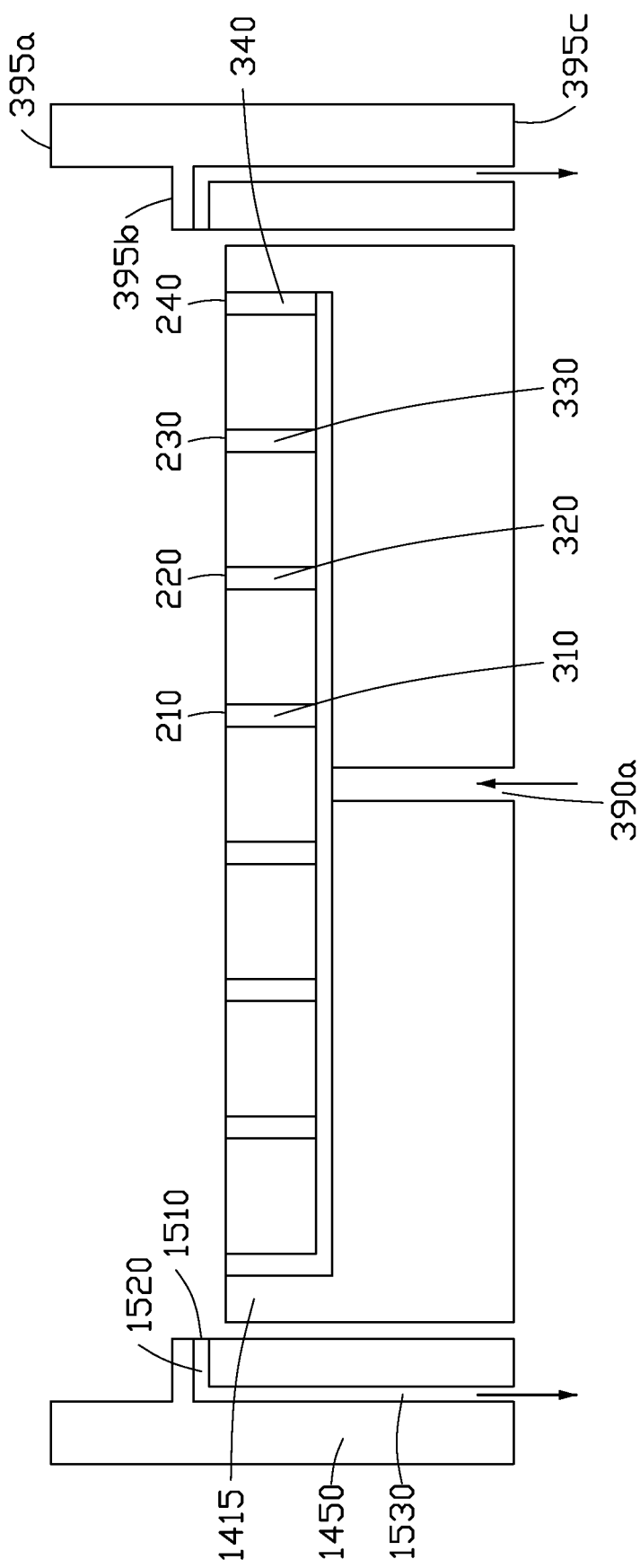
FIG. 15 is a schematic view illustrating a cross-sectional view of the fourth embodiment of a substrate edge holder in FIG. 14 taken along D-D line according to some embodiments of the present disclosure.

FIG. 15 is a schematic view illustrating a cross-sectional view of the substrate support 1415 and a cross-sectional view of the fourth embodiment of a substrate edge holder 1500 in FIG. 14 taken along D-D line according to some embodiments of the present disclosure. As illustrated in FIG. 15, the substrate support 1415 is dispensed with the channels 350-380. Moreover, the substrate edge holder 1500 of this embodiment differs from the substrate edge holder 120 in that the substrate edge holder 1500 has a sidewall formed with a fourth opening 1510, a fourth channel 1520 connected to fourth opening 1510, and a fourth inlet 1530 connected between the fourth channel 1520 and the vacuum. The second gas/air may be evacuated by the vacuum through the third opening 1510, the third channel 1520, and the fourth inlet 1530 of the substrate edge holder 1500.

Figure 16:
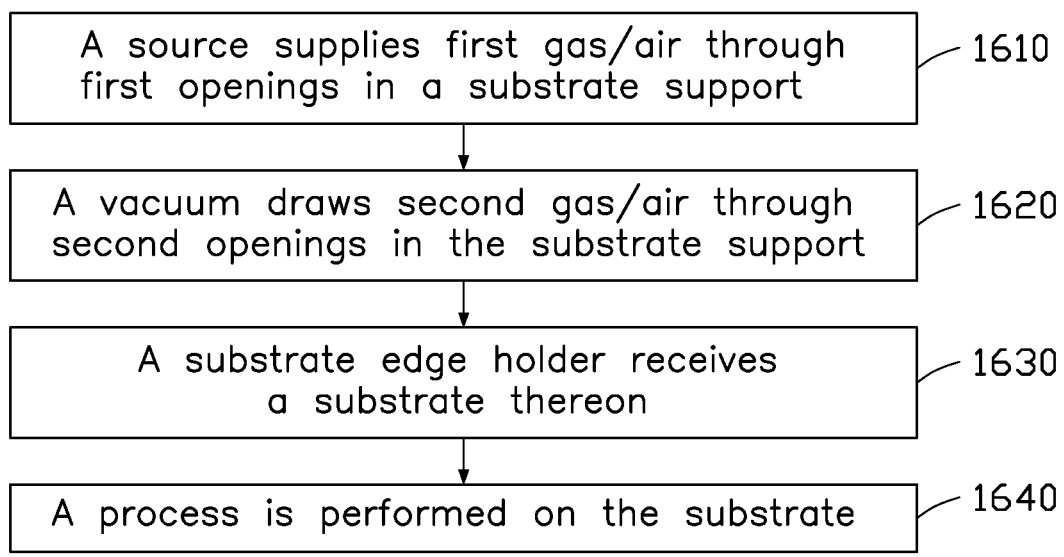
FIG. 16 is a flowchart illustrating the first embodiment of a method for processing a substrate according to some embodiments of the present disclosure.

FIG. 16 is a flowchart illustrating the first embodiment of a method for processing a substrate according to some embodiments of the present disclosure. Method 1600 will be described with reference to FIGS. 1-10. As illustrated in FIG. 16, in block 1610, a source supplies first gas/air through first openings, e.g., openings 210-240, 510-540, 710-740, 910-940, in a substrate support, e.g., substrate support 115, 415, 515, 615, 715, 915.

In block 1620, a vacuum draws/evacuates second gas/air along a top surface of the substrate support through second openings, e.g., openings 250-270, 650-670, and a center opening, e.g., center opening 280, in the substrate support.

In block 1630, a substrate edge holder, e.g., substrate edge holder 120, receives a substrate thereon. The first gas/air and the second gas/air maintain the substrate and the top surface of the substrate support in a spaced-apart relationship. A gap between the substrate and the top surface of the substrate support may be adjusted by varying the pressure of the source and/or the vacuum. The substrate edge holder maintains the substrate at the center of the substrate support.

In block 1640, a lithographic process is performed on the substrate. In an alternative embodiment, in block 1640, an inspection process is performed on the substrate.

In this embodiment, supplying the first gas/air and drawing/evacuating the second gas/air are performed continuously. In an alternative embodiment, supplying the first gas/air and drawing the second gas/air are performed intermittently. In some embodiments, supplying the first gas/air is performed continuously and drawing the second gas/air is performed intermittently. In other embodiments, supplying the first gas/air is performed intermittently and drawing the second gas/air is performed continuously. In certain embodiments, supplying the first gas/air and drawing the second gas/air are performed alternately.

Figure 17:
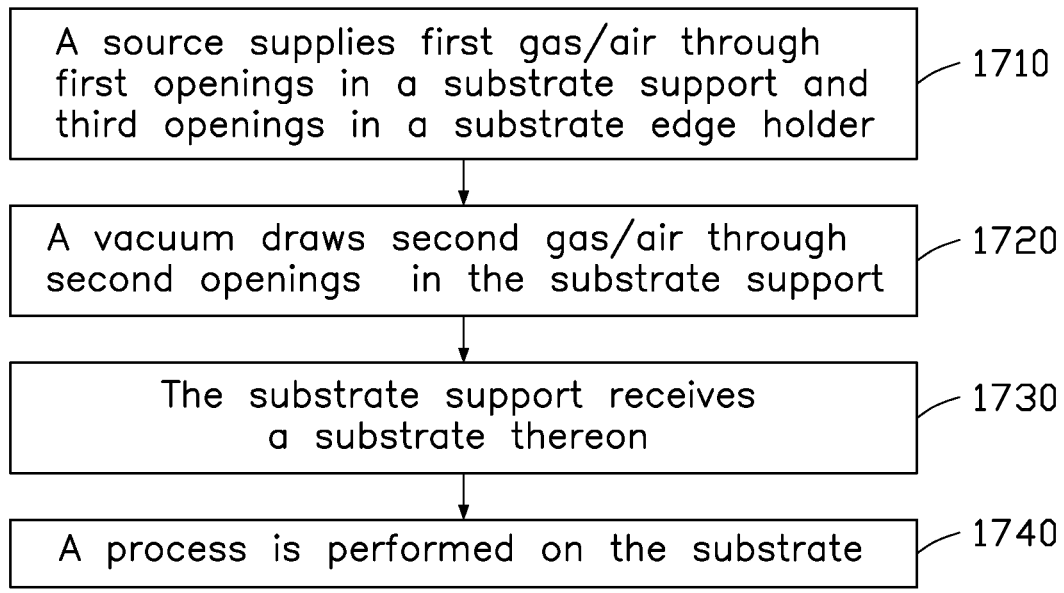
FIG. 17 is a flowchart illustrating the second embodiment of a method for processing a substrate according to some embodiments of the present disclosure.

FIG. 17 is a flowchart illustrating the second embodiment of a method for processing a substrate according to some embodiments of the present disclosure. Method 1700 will be described with reference to FIGS. 11 and 12. As illustrated in FIG. 17, in block 1710, the gas/air source supplies first gas/air through the first openings, e.g., openings 210-240, in the substrate support, e.g., substrate support 115, and through the third openings, e.g., openings 1110-1140, in the substrate edge holder, e.g., substrate edge holder 1100.

In block 1720, the vacuum draws second gas/air along a top surface of the substrate support through the second openings, e.g., openings 250-270, and a center opening, e.g., center opening 280, in the substrate support.

In block 1730, the substrate support receives a substrate thereon. The first gas/air and the second gas/air maintain the substrate and the top surface of the substrate support in a spaced-apart relationship. A gap between the substrate and the top surface of the substrate support may be adjusted by varying the pressure of the gas/air and/or the vacuum. The first gas/air through the third openings of the substrate edge holder maintains the substrate at the center of the substrate support.

In block 1740, a lithographic process is performed on the substrate. In an alternative embodiment, in block 1740, an inspection process is performed on the substrate.

In this embodiment, supplying the first gas/air through the first and third openings and drawing the second gas/air through the second openings is performed continuously. In an alternative embodiment, supplying the first gas/air through the first and third openings and drawing the second gas/air through the second openings are performed intermittently. In some embodiments, supplying the first gas/air through the first and third openings is performed continuously and drawing the second gas/air through the second openings is performed intermittently. In other embodiments, supplying the first gas/air through the first and third openings is performed intermittently and drawing the second gas/air through the second openings is performed continuously. In certain embodiments, supplying the first gas/air through the first and third openings and drawing the second gas/air through the second openings are performed alternately.

Figure 18:
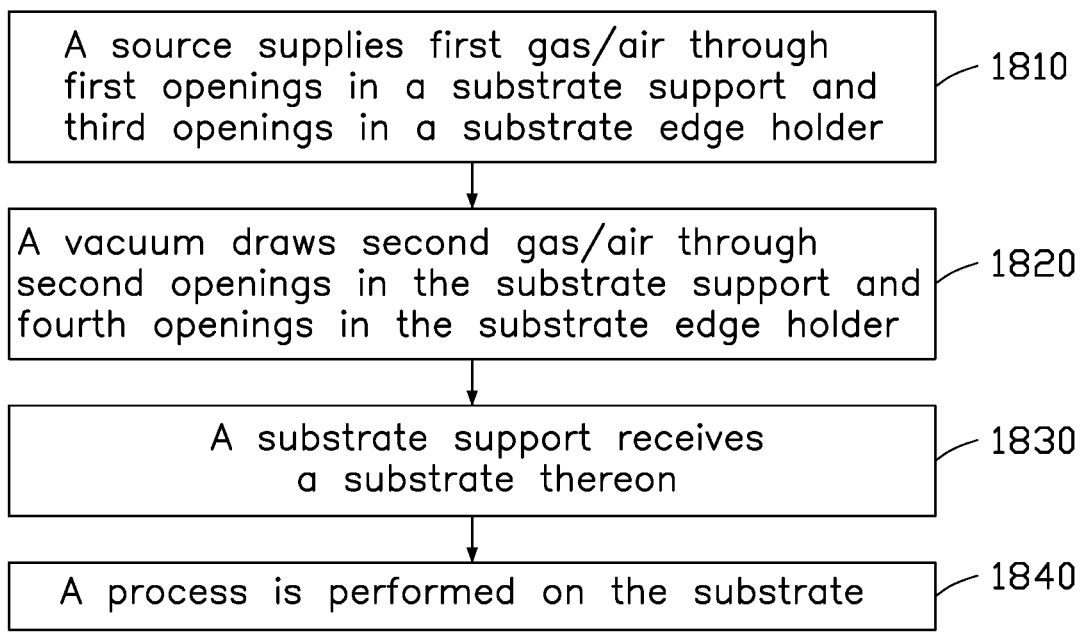
FIG. 18 is a flowchart illustrating the third embodiment of a method for processing a substrate according to some embodiments of the present disclosure.

FIG. 18 is a flowchart illustrating the third embodiment of a method for processing a substrate according to some embodiments of the present disclosure. Method 1800 will be described with reference to FIG. 13. As illustrated in FIG. 18, in block 1810, the gas/air source supplies first gas/air through the first openings, e.g., openings 210-240, in the substrate support, e.g., substrate support 115, and through the third opening, e.g., openings 1310, in the substrate edge holder, e.g., substrate edge holder 1300.

In block 1820, the vacuum draws second gas/air along a top surface of the substrate support through the second openings, e.g., openings 250-270, and a center opening, e.g., center opening 280, in the substrate support and through the fourth opening, e.g., openings 1320, in the substrate edge holder.

In block 1830, the substrate support receives a substrate thereon. The first gas/air and the second gas/air maintain the substrate and the top surface of the substrate support in a spaced-apart relationship. A gap between the substrate and the top surface of the substrate support may be adjusted by varying the pressure of the gas/air and/or the vacuum. The first gas/air through the third opening of the substrate edge holder maintains the substrate at the center of the substrate support.

In block 1840, performing a lithographic process on the substrate. In an alternative embodiment, in block 1840, an inspection process is performed on the substrate.

In this embodiment, supplying the first gas/air through the first and third openings and drawing the second gas/air through the second and fourth openings are performed continuously. In an alternative embodiment, supplying the first gas/air through the first and third openings and drawing the second gas/air through the second and fourth openings are performed intermittently. In some embodiments, supplying the first gas/air through the first and third openings is performed continuously and drawing the second gas/air through the second and fourth openings is performed intermittently. In other embodiments, supplying the first gas/air through the first and third openings is performed intermittently and drawing the second gas/air through the second and fourth openings is performed continuously. In certain embodiments, supplying the first gas/air through the first and third openings and drawing the second gas/air through the second and fourth openings are performed alternately.

Figure 19:
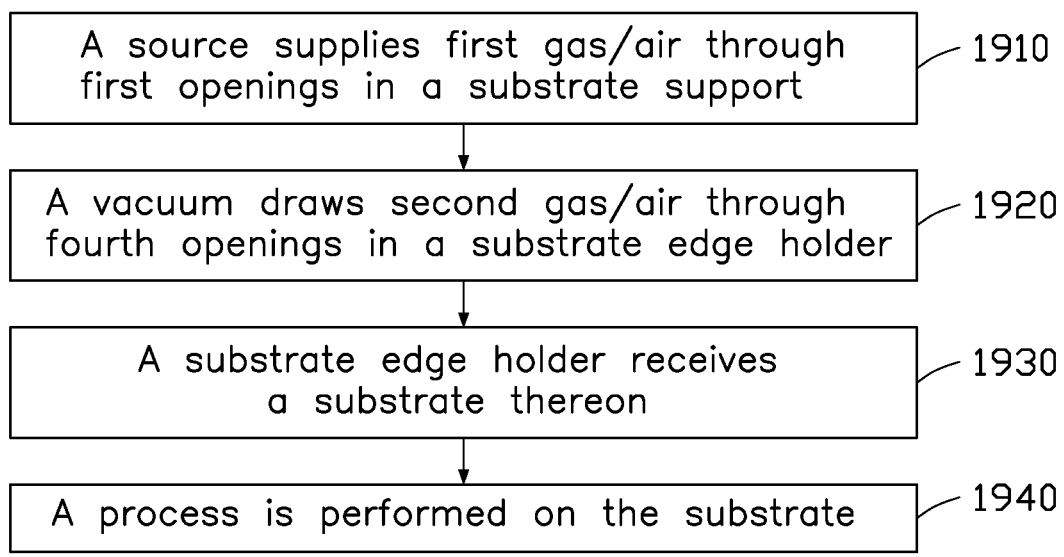
FIG. 19 is a flowchart illustrating the fourth embodiment of a method for processing a substrate according to some embodiments of the present disclosure.

FIG. 19 is a flowchart illustrating the fourth embodiment of a method for processing a substrate according to some embodiments of the present disclosure. Method 1900 will be described with reference to FIGS. 14 and 15. As illustrated in FIG. 19, in block 1910, the gas/air source supplies first gas/air through the first openings, e.g., openings 1410-1440, in the substrate support, e.g., substrate support 1415.

In block 1920, the vacuum draws second gas/air along a top surface of the substrate support through the fourth opening, e.g., openings 1510, in a substrate edge holder, e.g., substrate edge holder 1450.

In block 1930, the substrate edge holder receives a substrate thereon. The first gas/air and the second gas/air maintain the substrate and the top surface of the substrate support in a spaced-apart relationship. A gap between the substrate and the top surface of the substrate support may be adjusted by varying the pressure of the gas/air and/or the vacuum. The substrate edge holder maintains the substrate at the center of the substrate support.

In block 1940, performing a lithographic process on the substrate. In an alternative embodiment, in block 1940, an inspection process is performed on the substrate.

In this embodiment, supplying the first gas/air through the first openings and drawing the second gas/air though the fourth opening are performed continuously. In an alternative embodiment, supplying the first gas/air through the first openings and drawing the second gas/air are performed intermittently. In some embodiments, supplying the first gas/air through the first openings is performed continuously and drawing the second gas/air through the fourth opening is performed intermittently. In other embodiments, supplying the first gas/air through the first opening is performed intermittently and drawing the second gas/air through the fourth opening is performed continuously. In certain embodiments, supplying the first gas/air through the first openings and drawing the second gas/air through the fourth opening are performed alternately.

In an embodiment, an apparatus for processing the substrate includes a substrate stage and a source. The substrate stage is configured to support a substrate thereon. The substrate stage includes a substrate support formed with a first opening therein. The first opening is an annular opening.

The source is coupled to the first opening and is configured to supply first gas/air to a bottom surface of the substrate through the first opening.

In another embodiment, an apparatus for processing a substrate includes a substrate stage and a source. The substrate state is configured to support a substrate thereon and includes a substrate support and a substrate edge holder. The substrate edge holder is adjacent the substrate support and has a sidewall formed with a first opening therein. The source is coupled to the first opening and is configured to supply first gas/air to an edge of the substrate through the first opening to maintain the substrate at the center of the substrate support.

In another embodiment, a method for processing a substrate includes supplying first air/gas through first openings in a substrate support, receiving a substrate on the substrate support, maintaining the substrate at a center of the substrate support, and performing a process on the substrate. At least one of the first openings is elongated.

The embodiments shown and described above are only examples. Many details are often found in the art such as the other features of a substrate support and a substrate edge holder. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the implementations described above may be modified within the scope of the claims.

What is claimed is:

1. An apparatus for processing a substrate, comprising:
    a substrate stage configured to support a substrate thereon, the substrate stage including a substrate support formed with a plurality of first openings, a plurality of second opening, and a center opening therein, wherein each first opening is an annular opening, each second opening is an annular opening, the center openings is a circular opening, the first openings and the second opening are alternately arranged, the center opening is disposed at a center of an innermost one of the first openings, a width of each first opening is equal to a width of each second opening, a width of the center opening is larger than the width of each first opening;
    a source coupled to the first openings and configured to supply first gas/air to a bottom surface of the substrate through the first openings to elevate the substrate on the substrate support; and
    a vacuum coupled to the second openings and configured to evacuate second gas/air between a top surface of the substrate support and the bottom surface of the substrate through the second openings to stabilize a position of the substrate.

2. The apparatus of claim 1, wherein the substrate stage further includes a substrate edge holder adjacent the substrate support and having a sidewall formed with a third opening coupled to the vacuum.

3. The apparatus of claim 1, wherein the second opening is a rounded hole.

4. The apparatus of claim 1, wherein the substrate support includes a raised portion formed on a top surface thereof and the first opening is formed in the raised portion.

5. A method of processing a substrate, the method comprising:
    providing an apparatus, the apparatus comprising a substrate stage, the substrate stage including a substrate support formed with a plurality of first openings, a plurality of second opening, and a center opening therein, wherein each first opening is an annular opening, each second opening is an annular opening, the center openings is a circular opening, the first openings and the second opening are alternately arranged, the center opening is disposed at a center of an innermost one of the first openings, a width of each first opening is equal to a width of each second opening, a width of the center opening is larger than the width of each first opening;
    supplying first air/gas through the first openings;
    drawing second gas/air through the second openings;
    receiving a substrate on the substrate support;
    maintaining the substrate at a center of the substrate support;
    performing a process on the substrate.

6. The method of claim 5, further comprising supplying the first air/gas through a third opening in a substrate edge holder adjacent the substrate support.

7. The method of claim 5, further comprising drawing the second air/gas through a fourth openings in a substrate edge holder adjacent the substrate support.

8. The method of claim 5, wherein supplying the first air/gas and the drawing of the second air/gas are performed alternately.

9. The method of claim 5, wherein supplying the first air/gas is performed intermittently.

10. The method of claim 5, wherein drawing the second air/gas is performed intermittently.

* * * * *